Sept. 9, 1969 J. H. RUBY 3,466,559

BANDPASS VOLTAGE AMPLIFIER

Filed June 16, 1967 2 Sheets-Sheet 1

INVENTOR
J. H. RUBY
BY *David P. Kelley*
ATTORNEY

Sept. 9, 1969 J. H. RUBY 3,466,559

BANDPASS VOLTAGE AMPLIFIER

Filed June 16, 1967 2 Sheets-Sheet 2

United States Patent Office 3,466,559

Patented Sept. 9, 1969

3,466,559
BANDPASS VOLTAGE AMPLIFIER

Joe H. Ruby, Columbus, Ohio, assignor to Bell Telephone Laboratories, Incorporated, Murray Hill, N.J., a corporation of New York Filed June 16, 1967, Ser. No. 646,690
Int. Cl. H03f *1/08, 1/34*
U.S. Cl. 330—28 7 Claims

ABSTRACT OF THE DISCLOSURE

A bandpass voltage amplifier includes in a forward transmission path a high gain, low pass amplifier. Direct coupled from the output to the input of the forward amplifier, and in a negative voltage feedback arrangement therewith, is a low gain, low pass amplifier having an upper cutoff frequency less than that of the forward amplifier. Bandpass characteristics are obtained, without the use of capacitors or inductors, by utilizing the inherent low pass characteristics of transistor amplifiers.

BACKGROUND OF THE INVENTION

This invention relates to bandpass voltage amplifiers and more particularly to voltage amplifiers the bandpass characteristics of which are not dependent on the use of capacitors or inductors.

A bandpass amplifier is characterized by high amplification of signals having frequencies within a particular range of frequencies, termed the passband, while signals having frequencies outside the passband are amplified to a considerably less extent or not at all. To create this bandpass characteristic in prior art amplifiers, in general, use has been made of capacitors and inductors in various tuned circuit arrangements.

It has become apparent in integrated circuit technology that the fabrication of inductors, and to a lesser extent large capacitors, is not always practical. In the case of inductors, no practicable integrated circuit fabrication technique has yet been developed, and in the case of large capacitors, the fabricated form is often so large as to defeat the aim of miniaturization.

It is desirable in order to exploit the many obvious advantages of integrated circuits and simultaneously obtain bandpass characteristics to have a bandpass amplifier which utilizes neither capacitors nor inductors.

SUMMARY OF THE INVENTION

The present invention is a voltage amplifier which obtains bandpass characteristics without the use of capacitors or inductors and can therefore be readily fabricated in integrated circuit form. The invention is based upon the fact that the inherent low pass characteristic of transistor amplifiers connected in a negative voltage feedback arrangement results in an overall bandpass characteristic.

In an illustrative embodiment, the invention comprises a high gain, low pass forward amplifier, and a low gain, low pass amplifier coupled from the output to the input of the forward amplifier in a negative voltage feedback configuration. The low gain, low pass amplifier has an upper cutoff frequency less than that of the forward amplifier.

The forward amplifier ideally amplifies signals at frequencies from D.C. to its relatively high upper cutoff frequency. The feedback amplifier samples the output voltage of the forward amplifier, but ideally transmits back to the input of forward amplifier only that portion of sampled signal at frequencies between D.C. and its relatively low upper cutoff frequency. Because the connection of the amplifiers is in negative voltage feedback, the feedback signal is subtracted from the input to the forward amplifier. The net effect is that only signals at frequencies in the range between the two upper cutoff frequencies are amplified. The actual passband range may be somewhat less than the difference between cutoff frequencies because of the inherent cutoff characteristics of the amplifiers and the actual circuit configuration.

BRIEF DESCRIPTION OF THE DRAWING

The invention, together with its various features and advantages, can be easily understood from the following more detailed description taken in conjunction with the following drawing, in which.

DETAILED DESCRIPTION

Figure 2B:
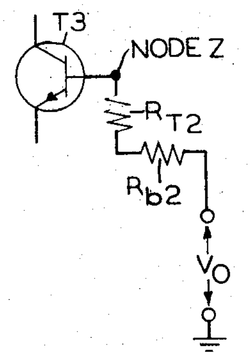
FIG. 2B is a circuit schematic of an approximate equivalent circuit of a portion of amplifier shown in FIG. 2A.
Figures 1, 2A:
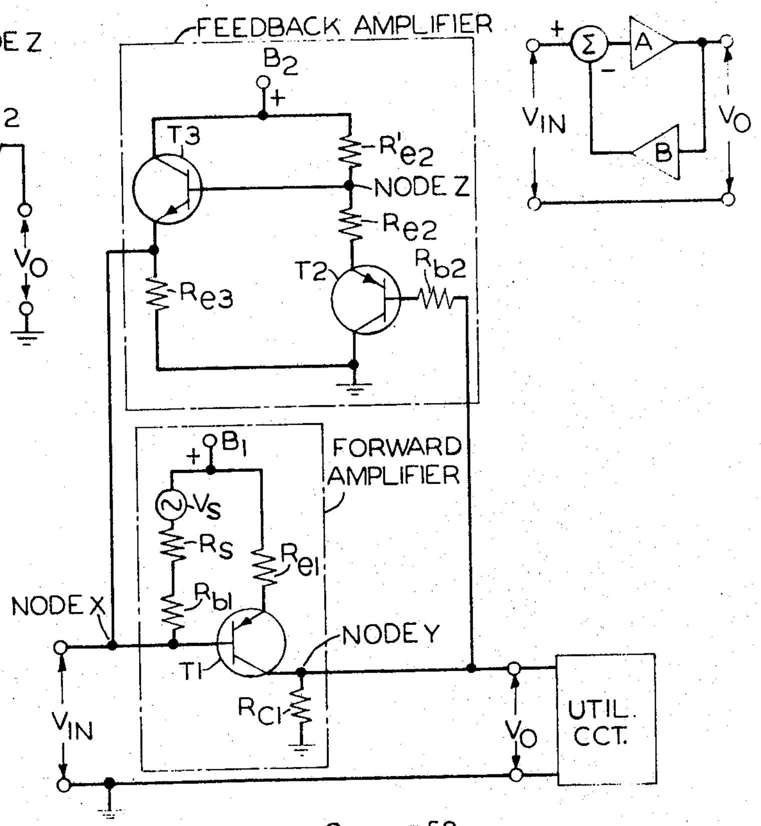
FIG. 1 is a block diagram schematic of the general embodiment of the invention.
FIG. 2A is a circuit schematic of an illustrative embodiment of a bandpass voltage amplifier in accordance with the invention.

Turning now to FIG. 1, there is shown a block diagram of a bandpass voltage amplifier in accordance with the principles of the invention. The bandpass amplifier comprises in a forward transmission path a forward amplifier A, and, D.C. coupled in negative voltage feedback therewith, a feedback amplifier B.

The voltage gain versus frequency characteristic of an ideal forward amplifier A is a low pass characteristic with upper cutoff frequency $f_a$, typically in the mHz. range. The gain $A_0$ of amplifier A in the low pass region is relatively high, typically 100.

The voltage gain characteristic of the feedback amplifier B is topographically similar to that of amplifier A in that both exhibit low pass properties. However, both the voltage gain, typically unity, and upper cutoff frequency, typically in kHz. range, of amplifier B are less than those of amplifier A.

The overall voltage gain characteristic of the bandpass amplifier of FIG. 1 is such that only signals within a particular range, defined by the 3 db cutoff frequencies $f_1$ and $f_2$, undergo significant amplification. The range of frequencies between $f_1$ and $f_2$ define the bandpass or bandwidth of the amplifier. The midband gain, designated $G_0$, is less than gain $A_0$ of the forward amplifier A.

That a bandpass characteristic indeed results from connecting two low pass amplifiers in negative voltage feedback relationship can be verified mathematically (as well as practically). The ideal gain characteristic of the forward amplifier A can be expressed approximately in the following form.

$$G_a(f)=\frac{A_o}{1+j\frac{f}{f_a}} \tag{1}$$

and that of feedback amplifier B as $$G_b(f)=\frac{B_o}{1+j\frac{f}{f_b}} \tag{2}$$

The gain of the overall bandpass amplifier is given by $$G(f)=\frac{G_a(f)}{1+G_a(f)G_b(f)} \tag{3}$$

or, after substituting Equations 1 and 2 into Equation 3 and rearranging, $$G(f)=\frac{A_oB_o}{\left(1+j\frac{f}{f_a}\right)\left(1+j\frac{f}{f_b}\right)+A_oB_o} \quad (4)$$

which, when plotted, produces a bandpass gain characteristic.

Intuitively, it can be seen that the mathematical result is reasonable. The forward amplifier A, standing alone, would amplify all signals having frequencies from D.C. to $f_a$. By connecting amplifier B in negative voltage feedback signals having frequencies from D.C. to $f_b$ are sampled at the output, transmitted by amplifier B, and subsequently subtracted (via summation element Σ shown in FIG. 1) from the input. The net effect is that only signals at frequencies between $f_b$ and $f_a$ are significantly amplified. The actual bandpass region ($f_1$ to $f_2$) may be less than the range defined by $f_a$ and $f_b$ depending on the inherent amplifier characteristics and the particular circuit configuration. It is readily apparent, however, that the low end cutoff $f_1$ is determined primarily by the feedback amplifier B whereas the high end cutoff $f_2$ is substantially determined by the forward amplifier A.

An illustrative embodiment of a bandpass voltage amplifier in accordance with the inventon is shown in FIG. 2A. The forward amplifier comprises a single stage of amplification provided by the PNP transistor T1 which has a high cutoff frequency, typically in the megahertz range. The collector of T1 is grounded through resistor $R_{c1}$, across which the output $V_o$ of the bandpass amplifier is taken. Across the output is connected a utilization circuit. The emitter of T1 is coupled through resistor $R_{e1}$ to a source of positive voltage $B_1{+}$, and the base of T1 is connected through resistor $R_{b1}$ to a floating signal source $V_s$ (and its associated series resistance $R_s$) which is in turn connected to $B_1{+}$. Although $V_s$ represents the actual signal input, the voltage $V_{in}$, from NODE X (the base of T1) to ground, is the voltage measured for purposes of determining the voltage gain ($G=V_o/V_{in}$) of the bandpass amplifier. $V_s$ is not connected from NODE X to ground in order that the requisite D.C. voltages be established at NODE X. It will be noted that $B_1{+}$, to which $V_s$ is connected, is at A.C. ground, and therefore in effect $V_s$ is established at the input $V_{in}$.

The feedback amplifier comprises two emitter follower stages both in a normal, not inverted, connection. One stage includes PNP transistor T2 which is the amplifier, and the other stage includes NPN transistor T3 which is an isolator. The amplifier T2 samples the output voltage $V_o$ through resistor $R_{b2}$ connected between its base and $V_o$. The collector of T2 is directly grounded, whereas its emitter is connected through a pair of series-connected resistors $R_{e2}$ and $R'_{e2}$ to a source of positive voltage $B_2{+}$. The junction point between $R_{e2}$ and $R'_{e2}$, defined as NODE Z, is directly coupled to the base input of isolator T3. The collector of T3 is directly connected to $B_2{+}$, and its emitter is coupled through resistor $R_{e3}$ to ground. The output voltage of T3, taken across $R_{e3}$, is fed back to NODE X, the input to the bandpass amplifier. The voltage feedback is negative, of course, because the input and output of T1 are 180° out of phase.

The need for the isolation stage T3 arises from the fact that the impedance looking into NODE X is normally low, typically several kilohms. If this low impedance point were directly coupled to NODE Z, the output of amplifier $T_2$, the effect would be to load down undesirably the amplifier T2. The emitter follower T3, which has a high input impedance, is therefore interposed between T1 and T2 to alleviate this problem. Of course, the isolator stage T3 could be eliminated in some circuit configurations, e.g., one in which impedance at NODE Z is increased by increasing the input impedance of T1.

The operation of the bandpass voltage amplifier is based upon the frequency cutoff characteristics of the transistors. That is, it is the inherent property of transistors that their base-collector current gain, designated as $\beta$, is a function of frequency. From D.C. to nearly the upper cutoff frequency $\beta$ remains constant. For frequencies above the cutoff $\beta$ decreases rapidly in an exponential fashion. This property is utilized in the feedback amplifier T2 to produce the low frequency cutoff of the bandpass amplifier. The high frequency cutoff is dtermined, as previously mentioned, primarily by the low pass characteristics of the forward amplifier T1.

The frequency dependent property of $\beta$ is utilized in amplifier T2 to control the amount of the output voltage $V_o$ which is fed back to the input NODE X. At low frequencies, it is desirable that a large proportion of $V_o$ be fed back to cancel the input and thus shape low frequency cutoff. At higher frequencies, a smaller proportion of $V_o$ is fed back giving rise to a peak at midband. At still higher frequencies, the decreased $\beta$ of amplifier T1 shapes a high frequency cutoff.

To understand this phenomenon more fully, consider the portion of the circuit between the input to isolator T3 (i.e., NODE Z) and the output $V_o$ which includes $R_{e2}$, T2 and $R_{b2}$. These components form a frequency sensitive voltage divider which controls the proportion of the output voltage $V_o$ which appears at NODE Z, the input to T3. Since T3 drives the input NODE X to the bandpass amplifier, this frequency sensitive voltage divider also controls the proportion of $V_o$ which is fed back to the bandpass amplifier input.

The analysis of the voltage divider taken in conjunction with an approximate equivalent circuit shown in FIG. 2 is as follows. From an impedance standpoint, the amplifier T2 can be replaced by an impedance $R_{T2}$ which represents the impedance looking into its base, and is given by $$R_{T2}\approx r_{b2}+\beta_2(r_{e2}+R_{e2}+R_z) \quad (5)$$

where $r_{b2}$ and $r_{e2}$ are respectively the intrinsic base and emitter resistances of T2; $\beta_2$ is the frequency dependent current gain of T2; and $R_z$ is the impedance looking into NODE Z (i.e., into $R'_{e2}$ and the base of T3).

At low frequencies, below cutoff, $\beta_2$ is relatively high, typically 100, and therefore $R_{T2}$ is also relatively high, typically 400 kilohms. Consequently, a large voltage, relative to that across $R_{b2}$ (typically 40 kilohms), exists across $R_{T2}$ and therefore at the base of T3. This large voltage is coupled through T3 to NODE X, the bandpass amplifier input, where it is subtracted (i.e., the negative voltage is added) from the input thereby reducing the overall gain.

On the other hand, at higher frequencies, above cutoff, $\beta_2$ decreases rapidly, typically to unity, and therefore $R_{T2}$ also decreases by nearly a factor of 100, typically to 4 kilohms. In this case, a much smaller voltage exists across $R_{T2}$ than across $R_{b2}$. Consequently, a much smaller voltage is subsequently subtracted at NODE X, allowing for a higher overall gain.

As frequency is increased still further, eventually the current gain $\beta_1$ of T1 begins to decrease causing both the forward gain of T1 to decrease as well as the overall bandpass amplifier gain. Thus, as predicted, the gain characteristic of the amplifier is bandpass.

The following table lists typical component values for the circuit shown in FIG. 2.

Forward amplifier

| | | |
|---|---|---|
| $\beta_1$ | | 100 |
| $G_1$ (midband) | | 50 |
| $f_{T1}$ | mHz | 500 |
| $R_{e1}$ | ohms | 24 |
| $R_{b1}$ a | do | 50 |
| $R_{c1}$ | do | 4,000 |
| $R_s$ | do | 1,200 |
| $B_1{+}$ | volts | +19 |

Feedback amplifier

| | | |
|---|---|---|
| $\beta_2$ | | 83 |
| $G_{23}$ (midband) | | 0.64 |
| $f_{T2}$ | mHz. | 0.45 |
| $R_{e2}$ | ohms | 3,000 |
| $R'_{e2}$ | do | 1,000 |
| $R_{b2}$ | do | 38,000 |
| $\beta_3$ | | 100 |
| $f_{T3}$ | mHz. | 300 |
| $R_{e3}$ | ohms | 10,600 |
| $B_2{}^+$ | volts | +40 |

where $G_1$ and $G_{23}$ are the loaded gains of the forward and feedback amplifiers, respectively, with the feedback loop opened at NODE Y. The frequency $f_T$ is approximately the frequency at which the magnitude of $\beta$ is unity.

The above component values are illustrative only and are not to be considered as limitations on the scope of the invention.

Figure 3:
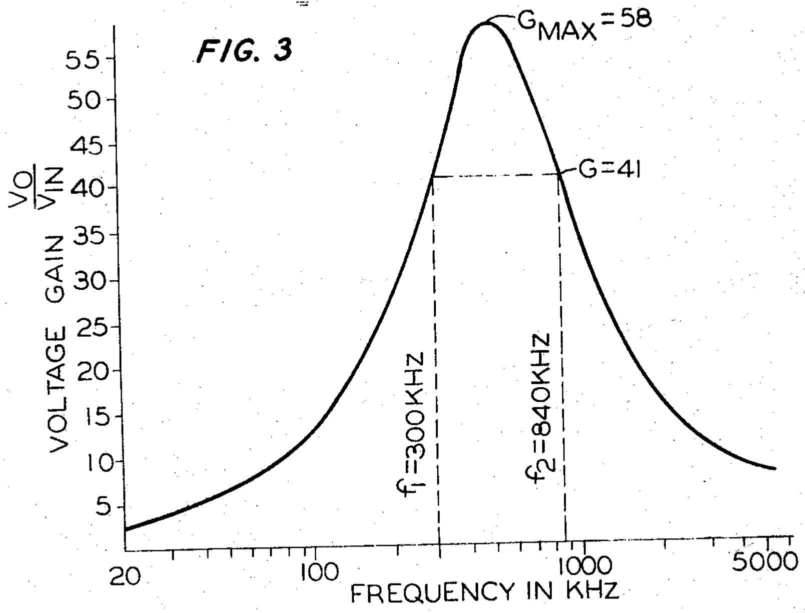
FIG. 3 is a graph of voltage gain versus frequency for the bandpass voltage amplifier shown in FIG. 2A.

FIG. 3 is a graph of the bandpass characteristic of the amplifier of FIG. 2 having the component values shown in the foregoing table. The passband is the range from the lower cutoff frequency $f_1$=300 mHz. to the upper cutoff frequency $f_2$=840 mHz., each defined as the frequency at which the gain is $1/\sqrt{2}$ of the midband or peak gain. The voltage gain $V_o/V_{in}$ at the peak is approximately 58 (at 500 mHz.) and the gain at each cutoff frequency is 41.

As pointed out previously this bandpass characteristic is obtained without the use of either capacitors or inductors, making the invention highly suitable to integrated circuit fabrication. Furthermore, the bandpass amplifier is D.C. stable without the use of capacitors. That is, any D.C. drift at the input is not amplified at the output because at D.C. the overall gain is approximately unity, as can be seen by substituting $f=0$ in Equation 4 and noting that $A_oB_o \gg 1$. Under these conditions $$G(o) \approx 1/B_o \approx 1$$

At least two problems are thereby alleviated. First, low level signals at the output are not masked by D.C. drift; and secondly, the little drift that does occur, since unamplified, is generally insufficient to drive the amplifier out of its linear range, thus avoiding nonlinearity problems.

To obtain higher overall voltage gain, it is possible to increase the gain of the forward amplifier by, for instance, increasing the number of its stages provided cascading stages does not cause the amplifier to oscillate. In addition, gain can be increased by merely cascading a number of bandpass amplifiers. If two stages are cascaded, for example, the midband gain would be squared (e.g., $50^2$=2500) and the D.C. gain would be squared as well (e.g., $1^2$=1). The latter factor is of importance in maintaining D.C. stability, as pointed out in the previous paragraph.

Figure 4:
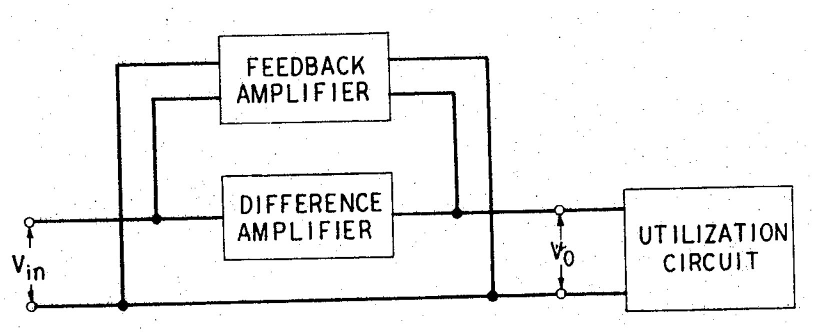
FIG. 4 is a block diagram of an embodiment of the invention utilizing a difference amplifier as the forward amplifier.

It is to be understood that the above-described arrangements are merely illustrative of the many possible specific embodiments which can be devised to represent application of the principles of the invention. Numerous and varied other arrangements may be devised in accordance with these principles by those skilled in the art without departing from the spirit and scope of the invention. For example, the forward amplifier need not be a single stage, but could comprise a number of cascaded stages or perhaps comprise a difference amplifier as shown in the block diagram of FIG. 4, the difference amplifier circuit being well known in the art.

What is claimed is:

1. A bandpass voltage amplifier comprising:
a forward amplifier comprising:
a high voltage gain, low pass D.C. amplifier having an upper cutoff frequency and being connected between a signal input terminal and a signal output terminal,
frequency sensitive negative voltage feedback means coupled from said output terminal to said input terminal for varying with frequency the proportion of the output subtracted from the input,
said means comprising an active circuit frequency sensitive voltage divider.

2. The bandpass voltage amplifier of claim 1 wherein said frequency sensitive voltage divider comprises:
fixed resistance means,
frequency dependent resistance means connected in series with said fixed resistance means and comprising a substantially unity gain voltage transistor amplifier in a normal connection having emitter, base and collector regions, said collector region being grounded, said base region being connected to said fixed resistance means and said emitter region being D.C. coupled to said input terminal, said transistor amplifier being a low pass D.C. amplifier having an upper cutoff frequency less than the upper cutoff frequency of said forward amplifier.

3. A bandpass voltage amplifier comprising:
a forward amplifier comprising a high voltage gain, low pass D.C. amplifier having an upper cutoff frequency and being connected in a forward transmission path, and
a feedback amplifier comprising a low voltage gain, low pass D.C. amplifier having an upper cutoff frequency less than the upper cutoff frequency of said forward amplifier, said feedback amplifier being D.C. coupled from the output to the input of said forward amplifier and in negative voltage feedback relationship therewith, whereby signals at a portion of the frequencies within a frequency range defined by the upper cutoff frequencies undergo substantial amplification.

4. The bandpass amplifier of claim 3 in combination with isolating means connected between the output of said feedback amplifier and the input of said forward amplifier.

5. The bandpass voltage amplifier of claim 3 wherein:
said forward amplifier comprises a D.C. coupled grounded emitter transistor amplifier having base, emitter and collector regions, said emitter region being grounded, said base region being responsive to signals to be amplified, said collector region being coupled to a utilization circuit, and
said feedback amplifier comprises a D.C. coupled emitter-follower transistor amplifier in a normal connection having base, emitter and collector regions, said base region being coupled to said collector region of said forward amplifier, said collector region being grounded and said emitter region being coupled to said base region of said forward amplifier.

6. The bandpass voltage amplifier of claim 3 wherein said forward amplifier comprises a D.C. coupled difference amplifier.

7. The bandpass voltage amplifier of claim 3 wherein:
said forward amplifier comprises:
a forward input and a forward output terminal,
a transistor having emitter base and collector regions, said emitter region being connected through an emitter resistor to a first source of voltage, said collector region being connected through a collector resistor to ground, said base region being connected through a base resistor to said input terminal,
said transistor being responsive to signal means applied between said input terminal and said first voltage source,
and said feedback amplifier comprises:
a feedback input and a feedback output terminal, said feedback input terminal being connected to said forward output terminal and said feedback output terminal being connected to said forward input terminal,
a first transistor in a normal connection having emitter, base, and collector regions, said collector region being connected directly to ground, said emitter region being connected through a pair of series connected emitter resistors to a second source of voltage, said base region being connected through a base resistor to said feedback input terminal, a second transistor in a normal connection having emitter, base, and collector regions, said collector region being connected directly to said second voltage source, said base region being directly connected to a point between said series connected emitter resistors, said emitter region being connected through an emitter resistor to ground and being directly coupled to said feedback output terminal.

References Cited

UNITED STATES PATENTS

| | | | |
|---|---|---|---|
| 3,130,329 | 4/1964 | Cother | 330—109 X |
| 3,233,125 | 2/1966 | Buie | 330—199 XR |
| 3,356,959 | 12/1967 | Vilkomerson | 330—85 X |

ROY LAKE, Primary Examiner

J. B. MULLINS, Assistant Examiner

U.S. Cl. X.R.

330—31, 85, 109